United States Patent

Rahimo et al.

(10) Patent No.: US 8,829,571 B2
(45) Date of Patent: Sep. 9, 2014

(54) PUNCH-THROUGH SEMICONDUCTOR DEVICE AND METHOD FOR PRODUCING SAME

(75) Inventors: Munaf Rahimo, Uezwil (CH); Arnost Kopta, Zürich (CH); Jan Vobecky, Lenzburg (CH); Wolfgang Janisch, Gränichen (CH)

(73) Assignee: ABB Technology AG, Zürich (CH)

( * ) Notice: Subject to any disclaimer, the term of this patent is extended or adjusted under 35 U.S.C. 154(b) by 0 days.

(21) Appl. No.: 13/468,593

(22) Filed: May 10, 2012

(65) Prior Publication Data

US 2012/0280272 A1 Nov. 8, 2012

Related U.S. Application Data

(63) Continuation of application No. PCT/EP2010/067175, filed on Nov. 10, 2010.

(30) Foreign Application Priority Data

Nov. 10, 2009 (EP) .................................. 09175454

(51) Int. Cl.
*H01L 29/66* (2006.01)
*H01L 29/06* (2006.01)
*H01L 29/739* (2006.01)

(52) U.S. Cl.
CPC ........ *H01L 29/7395* (2013.01); *H01L 29/0611* (2013.01); *H01L 29/66333* (2013.01)
USPC ............................ 257/197; 257/361; 438/309

(58) Field of Classification Search
USPC .......... 257/138, E21.383, E29.198, 205, 361, 257/273, E29.07, E29.066, E21.695; 438/137, 138, 520, 301, 478, 189, 202, 438/234, 309
See application file for complete search history.

(56) References Cited

U.S. PATENT DOCUMENTS

| 6,482,681 | B1* | 11/2002 | Francis et al. ................. 438/138 |
| 6,734,462 | B1* | 5/2004 | Shah ............................... 257/77 |
| 6,762,080 | B2 | 7/2004 | Linder | |
| 2002/0190281 | A1 | 12/2002 | Francis et al. | |
| 2003/0143836 | A1* | 7/2003 | Linder et al. .................. 438/627 |
| 2007/0096167 | A1 | 5/2007 | Francis et al. | |
| 2008/0315248 | A1 | 12/2008 | Tokura et al. | |
| 2009/0008674 | A1* | 1/2009 | Udrea ........................... 257/138 |

OTHER PUBLICATIONS

International Search Report (PCT/ISA/210) issued on Sep. 21, 2011, by the European Patent Office as the International Searching Authority for International Application No. PCT/EP2010/067175.
Baliga B J ED—Jayant Baliga B., "Chapter 3: Breakdown Voltage" Jan. 1995, Power Semiconductor Devices, PWS Pub.Co, Boston [U.A.], pp. 66-127, XP009114615.
Notification Concerning Transmittal of International Preliminary Report on Patentability (Forms PCT/IB/326 and PCT/IB/373) and the Written Opinion of the International Searching Authority (Form PCT/ISA/237) issued on May 24, 2012, in the corresponding International Application No. PCT/EP2010/067175. (8 pages).

* cited by examiner

*Primary Examiner* — Jarrett Stark
*Assistant Examiner* — Shahed Ahmed
(74) *Attorney, Agent, or Firm* — Buchanan Ingersoll & Rooney PC

(57) ABSTRACT

A maximum-punch-through semiconductor device such as an insulated gate bipolar transistor (IGBT) or a diode, and a method for producing same are disclosed. The MPT semiconductor device can include at least a two-layer structure having an emitter metallization, a channel region, a base layer with a predetermined doping concentration $N_D$, a buffer layer and a collector metallization. A thickness W of the base layer can be determined by:

$$W = \frac{V_{bd} + V_{pt}}{4010 \text{ kVcm}^{-5/8} * (N_D)^{1/8}}$$

wherein a punch-through voltage $V_{pt}$ of the semiconductor device is between 70% and 99% of a break down voltage $V_{bd}$ of the semiconductor device, and wherein the thickness W is a minimum thickness of the base layer between a junction to the channel region and the buffer layer.

19 Claims, 4 Drawing Sheets

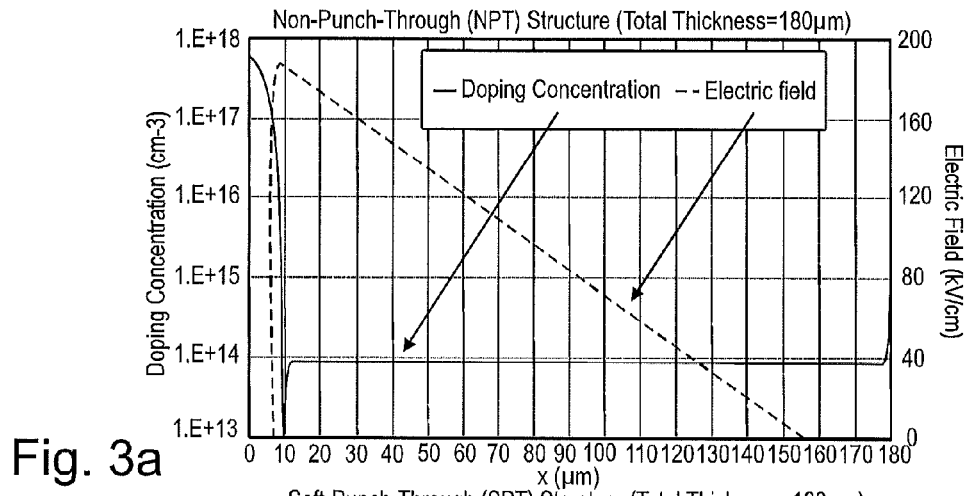
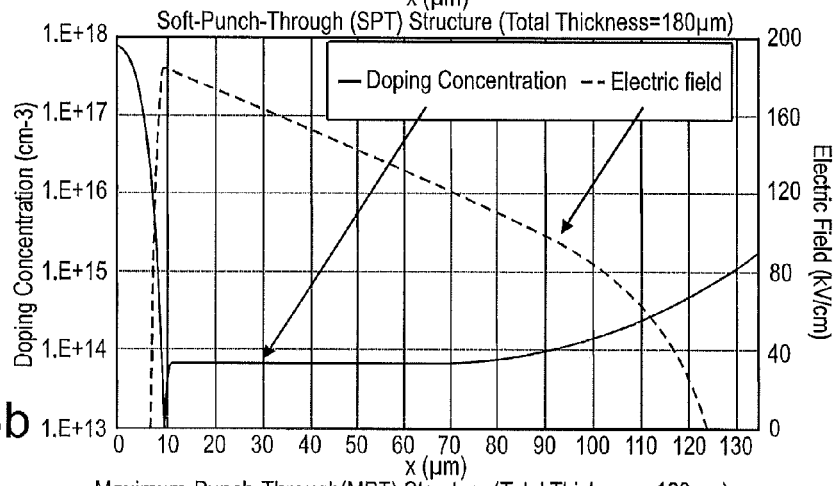
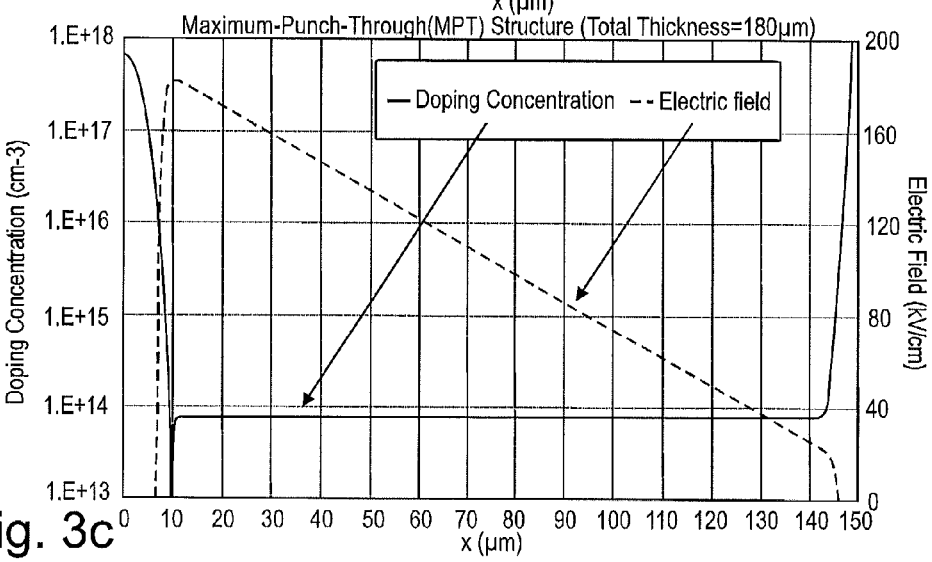

US 8,829,571 B2

PUNCH-THROUGH SEMICONDUCTOR DEVICE AND METHOD FOR PRODUCING SAME

RELATED APPLICATION

This application claims priority as a continuation application under 35 U.S.C. §120 to PCT/EP2010/067175, which was filed as an International Application on Nov. 10, 2010 designating the U.S., and which claims priority to European Application 09175454.9 filed in Europe on Nov. 10, 2009. The entire contents of these applications are hereby incorporated by reference in their entireties.

FIELD

Semiconductor power devices are disclosed, such as punch-through semiconductor devices, along with methods for producing such devices.

BACKGROUND INFORMATION

In power electronics devices including a pn-junction, substrates having a thickness larger than a maximum thickness of a depletion layer in reverse operation have been used. Thus, even at a maximum reverse voltage (i.e., slightly below a breakdown voltage of the device), the depletion layer and the electrical field prevailing therein do not reach to a collector of the device. Such devices are also referred to as non-punch-through devices (NPT).

However, it has been observed that electrical losses in electronic power devices strongly depend upon the thickness of the device. Accordingly, devices with reduced thickness have been developed.

In U.S. Pat. No. 6,762,080 B2 a punch-through (PT) insulated gate bipolar transistor (IGBT) is described. A doping concentration profile and a representation of an electrical field in such a PT-IGBT is schematically shown in FIG. 1. The device may be produced by using an n-doped wafer having a homogeneous doping concentration for forming a base layer 4. On top of the wafer all processes for manufacturing layers on an emitter side 31, also called cathode side, are performed (e.g., junctions and metallizations on the emitter side 31 are produced). The wafer further includes a deep highly doped n-type region opposite to the emitter side 31 for forming later, after thinning, a buffer layer 15. Afterwards, the wafer is thinned to the desired thickness leaving a buffer layer 15 on the collector side 21 of the wafer, which is opposite to the emitter side 31 and which is also called anode side. Then p-type particles are implanted on the collector side 21 of the wafer for forming a collector layer 6. The wafer is then annealed at 350° C. to 500° C. in order to activate the p-type particles without damage to the structure on the emitter side 31.

Due to the continuously rising doping concentration in the buffer layer 15 the reduction of the electric field during operation of the device increases within the buffer layer 15. Thus, the buffer layer 15 serves, in the blocking case, for decelerating the electric field (shown in FIG. 1 by the dotted line) before reaching the collector and thus keeping it away from said collector, since the semiconductor device can be destroyed if the electric field reaches the collector. The buffer layer can, for example, have a thickness in a range of 25 µm to 50 µm. Such devices may show reduced electrical losses. Due to the effect of the buffer layer 15, such devices are also referred to as soft-punch-through (SPT) devices.

Other devices with known doping concentration and thicknesses for the base layer and buffer layer are known from US 2009/0008674 A1, US 2008/0315248 A1 and US 2007/0096167 A1.

In U.S. Pat. No. 6,482,681 B1 an alternative punch-through (PT) IGBT is described. The device may be produced by using an n-doped wafer having a homogeneous doping concentration for forming a base layer 4, on top of which wafer all processes for manufacturing layers 10 on the emitter side 31, also called cathode side, are generated (e.g., junctions and metallizations on the emitter side 31 are produced). Afterwards, the wafer is thinned and hydrogen ions are implanted on the collector side 21 of the wafer, which is opposite to the emitter side 31 and which is also called anode side, for forming an $n^+$-doped buffer layer 15. Then p-type particles are implanted for forming a collector layer 6. The wafer is then annealed at 350° C. to 450° C. in order to activate the p-type particles and hydrogen ions without damage to the structure on the emitter side 31. The buffer layer 15 can also be formed by multiple hydrogen implants of progressively shallower and progressively higher total dose in order to form one buffer layer 15 with increasing doping concentration towards the collector and a peak dose concentration close to the collector.

However, it has been observed that SPT semiconductor devices may not always provide desired electrical characteristics in specific applications.

SUMMARY

A maximum-punch-through semiconductor device is disclosed having at least a two-layer structure comprising: a collector metallization on a collector side; an emitter metallization on an emitter side, which lies opposite the collector side; a base layer of a first conductivity type arranged between the emitter metallization and the collector metallization, and having a predetermined doping concentration $N_D$; a channel region of a second conductivity type arranged between the base layer and the emitter metallization; a buffer layer of the first conductivity type arranged between the base layer and the collector metallization, wherein the buffer layer has a peak doping concentration which is higher than a doping concentration of the base layer, a thickness W of the base layer being determined by:

$$W = \frac{V_{bd} + V_{pt}}{4010 \text{ kVcm}^{-5/8} * (N_D)^{1/8}}$$

wherein a punch-through voltage $V_{pt}$ of the semiconductor device is between 70% and 99% of a break down voltage $V_{bd}$ of the semiconductor device, and wherein the thickness W is a minimum thickness of the base layer between a junction to the channel region and the buffer layer.

A method for producing a maximum-punch-through semiconductor device is also disclosed having at least a two-layer structure with layers of different conductivity types, the method comprising, in the following order: (a) providing a wafer of a first conductivity type, having a first emitter side in a finalized semiconductor device, and a second side lying opposite the first side, and which wafer has a doping concentration $N_D$; (b) producing a channel region of a second conductivity type on the first side; and (c) applying particles of the first conductivity type to the wafer on the second side, which particles form a buffer layer in the finalized semiconductor device, wherein that part of the wafer with unamended doping concentration in the finalized semiconductor device forms a base layer, and the buffer layer has a peak doping concentration higher than the doping concentration of the wafer, and wherein a thickness of the base layer is selected such that:

$$W = \frac{V_{bd} + V_{pt}}{4010 \text{ kVcm}^{-5/8} * (N_D)^{1/8}},$$

wherein a punch-through voltage $V_{pt}$ of the semiconductor device is between 70% and 99% of a break down voltage $V_{bd}$ of the semiconductor device.

BRIEF DESCRIPTION OF THE DRAWINGS

Exemplary embodiments will be explained in more detail in the following text with reference to the attached drawings, in which:

FIG. 3a-c: show simulated doping profiles of a non-punch-through, a soft-punch-through and a maximum-punch-through semiconductor device according to an exemplary embodiment as disclosed herein;

Figure 1:
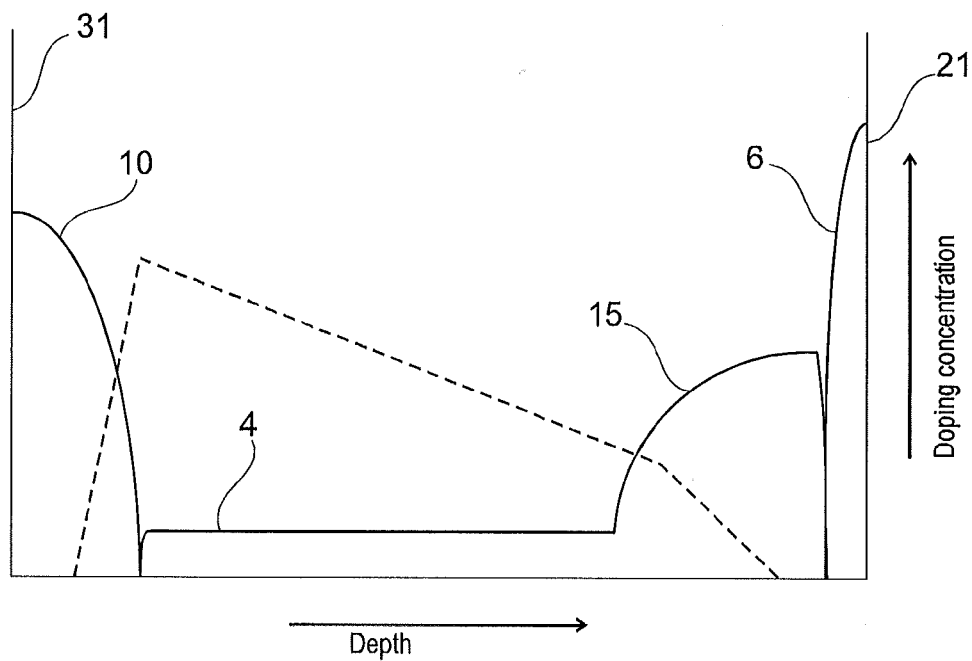
FIG. 1: shows a doping profile of a semiconductor module for a known punch-through semiconductor device.

The reference symbols used in the figures and their meaning are summarized in the list of reference symbols. The drawings are only schematic and not to scale. Generally, alike or alike-functioning parts are given the same reference symbols. The described embodiments are examples and should not be construed as limiting the scope of the claimed invention.

DETAILED DESCRIPTION

A punch-through semiconductor device is disclosed which can possess improved electrical characteristics. A method for producing such a punch-through semiconductor device is also described.

Aspects of the present disclosure have been developed based on the following findings: in known SPT semiconductor devices, such as for example SPT insulated gate bipolar transistors (IGBT), a deep buffer layer with a thickness of for example 30 μm to 35 μm has been implemented to support the punch-through action up to the break down voltage. For example, the breakdown voltage, which is sometimes also referred to as avalanche voltage, of an SPT IGBT rated with 1200 V may be 1300 V. The implemented buffer layer is low doped and may contribute significantly to overall losses of the semiconductor device. Such known semiconductor devices may suffer less soft turn-off characteristics. Furthermore, the process for implementing such a deep buffer for thin wafer devices may be complicated due to deep diffusions and/or defect introduction which may also affect device performance.

A new design rule is disclosed for punch-through semiconductor devices, particularly for IGBTs and MOSFETs. The new design rule may be advantageous for application to power semiconductor devices rated below 2000 V, as such relatively low rated power semiconductor devices can include thin semiconductor wafers.

As disclosed herein, a so-called maximum-punch-through (MPT) semi-conductor device can comprise at least a two-layer structure, wherein the at least two-layer structure comprises a collector metallization on a collector side of the semiconductor device; an emitter metallization on an emitter side, which lies opposite to the collector side; a base layer of a first conductivity type arranged between the emitter metallization and the collector metallization; a channel region of a second conductivity type which is arranged between the base layer and the emitter metallization, and a buffer layer arranged between the base layer and the collector metallization. Therein, the base layer may, for example, have a substantially constant doping concentration, meaning that the doping concentration is substantially homogeneous throughout the base layer, however without excluding that fluctuations in the doping concentration within the base layer being in the order of a factor of one to five may be possibly present due to, for example, a manufacturing process of the wafer being used. The buffer layer has a peak doping concentration which is higher than the doping concentration of the base layer.

The base layer has a thickness W between the junction to the channel region (10) and the buffer layer (5), which is determined by:

$$W = \frac{V_{bd} + V_{pt}}{4010 \text{ kVcm}^{-5/8} * (N_D)^{1/8}}$$

wherein a punch-through voltage $V_{pt}$ of the semiconductor device is between 70% and 99% of a break down voltage $V_{bd}$ of the semiconductor device. In another exemplary embodiment, the punch-through voltage $V_{pt}$ of the semiconductor device is between 75% and 99% of the break down voltage $V_{bd}$ of the semiconductor device, such as between 80 to 95%.

In this context, the "punch-through voltage" of the semiconductor device may be defined as the voltage when the space charge region (i.e., the depletion layer), reaches the buffer layer in a reverse bias. The "breakdown voltage" may be defined as the voltage at which a specific semiconductor device breaks down due for example to avalanche effects.

As both, the thickness of the space charge region at a specific reverse voltage and the breakdown voltage of the semiconductor device strongly depend upon a doping concentration within the base layer of the device, the proposed new design rule includes a selection range on the thickness of the base layer for a punch-through semiconductor device depending on the doping concentration of the base layer.

The proposed new design rule can be specifically applicable for power semiconductor devices such as IGBTs processed on thin wafers rated below 2000 V. Such an insulated gate bipolar transistor can comprise a source region of the first conductivity type between the channel region and the emitter metallization. On the collector side, a collector layer is arranged between the buffer layer and the collector metallization. The design rule may target an IGBT structure with a punch-through voltage value designed to be as close as possible to the avalanche breakdown voltage (e.g., for the given voltage class IGBT). For example, the design rule may be applied to a 1200 V IGBT and may result in a punch-through voltage above 1000 V. This may mean that a buffer design may be relaxed as it will only support the electrical field at very high voltages (i.e., between the punch-through voltage and the breakdown voltage). The proposed design rule may allow similar losses to be maintained as prevail in known SPT designs with a higher or similar blocking capability since the total thickness remains close to the original design by replacing the known thick buffer. The new design rule may also benefit from softer turn-off characteristics.

The peak doping concentration of the buffer layer may, for example, be above $1 \times 10^{15}$ cm$^{-3}$, preferably above $1 \times 10^{16}$ cm$^{-3}$ and more preferably up to $1 \times 10^{17}$ cm$^{-3}$. Accordingly, the peak doping concentration of the buffer layer may be higher than in known soft-punch-through semiconductor devices. Such high doping concentration may reliably prevent any electrical field within a space charge region from reaching the collector. It may also provide a higher bipolar gain for a reduced leakage current in the reverse blocking state and stable reverse blocking characteristics statically and dynamically.

A thickness of the buffer layer may be between, for example, 1 μm and 15 μm, preferably between 1 μm and 10 μm and more preferably between 2 μm and 8 μm or even as low as between 2 to 3 μm. In a buffer layer having no homogeneous doping concentration, a thickness of the buffer layer may be defined as a thickness of a layer having at least twice the doping concentration of the base layer. As the thickness of the buffer layer according to the presented new design rule may be significantly thinner than in known STP semiconductor devices, the buffer layer may be easier to be produced using for example ion implantation techniques.

The buffer layer can, for example, be arranged such that an electric field at the interface between the base layer and the buffer layer is below 40 kV/cm, such as below 20 kV/cm and in particular below 12 kV/cm.

The proposed new design rules may be applied to semiconductor devices in which the doping concentration of the base layer and the thickness of the base layer are adapted such that the breakdown voltage of the semiconductor device is below, for example, 2500 V, preferably below 2200 V and more preferably below 2000 V. As the rated voltage of a semiconductor device can be defined as being sufficiently below the breakdown voltage of the device, this may correspond to the semiconductor device having a rated voltage being for example smaller than 2000 V, preferably smaller than 1700 V. As already indicated, the proposed new design rule may be specifically suitable for such relatively low rated semiconductor devices. A reason may lie in the fact that for such devices, the design rules for the silicon base region thickness and resistivity may allow for high punch-through voltages when compared to higher voltage devices rated for example above 2000 V.

According to a yet another aspect, the semiconductor device can be a diode with a buffer layer in form of a diode cathode layer, the channel region in form of an anode layer, the emitter metallization in form of a diode anode metallization and the collector metallization in form of a cathode metallization.

According to a further aspect, a method is disclosed for producing a maximum-punch-through semiconductor device having at least a two-layer structure with layers of different conductivity types. The method comprises production steps being performed, by way of example only, in the following order:
  (a) providing a wafer of a first conductivity type with a doping concentration $N_D$, which comprises a first side which is the emitter side in the finalized semiconductor device, and a second side lying opposite the first side;
  (b) producing a channel region of the second conductivity type on the first side; and
  (c) applying particles of the first conductivity type to the wafer on its second side, such as by implantation or deposition of the particles of the first conductivity type, which particles form a buffer layer in the finalized semiconductor device. That part of the wafer with unamended doping concentration $N_D$ in the finalized semiconductor device forms a base layer. The buffer layer has a peak doping concentration being higher than the doping concentration $N_D$ of the wafer forming a base layer of the semiconductor device.

The device can be created such that the thickness of the base layer is selected according to $$W = \frac{V_{bd} + V_{pt}}{4010 \text{ kVcm}^{-5/8} * (N_D)^{1/8}},$$

wherein a punch-through voltage $V_{pt}$ of the semiconductor device is between, for example, 70% and 99% of a breakdown voltage $V_{bd}$ of the semiconductor device.

The production method may include a further processing step in that, after step (b), the wafer is thinned on its second side to a predetermined thickness. This predetermined thickness may be selected in accordance with the new design rules.

In step (c), the buffer layer may be created such the buffer layer extends only to such a depth of the wafer from the second side, that the electric field is lower than, for example, 40 kV/cm, in particular below 20 kV/cm and in particular below 12 kV/μm.

In step (c), n-type particles, such as Phosphor (P) or Arsenic (As) particles or, alternatively, hydrogen particles may be implanted with a dose higher than, for example, $1 \times 10^{12}$ cm$^{-2}$, preferably higher than $5 \times 10^{12}$ cm$^{-2}$, and with energies higher than 100 keV, preferably higher than 150 keV.

After step (c), an annealing step may be performed, wherein the annealing step comprises thermal annealing at temperatures below, for example, 500° C., preferably below 450° C. Alternatively, the annealing step may be performed by a laser annealing.

The method may be adapted for producing an insulated gate bipolar transistor and wherein, after step (c) as a step (d) particles of a second conductivity type are applied to the wafer on its second side, such as by implantation or deposition, which particles form a collector layer in the finalized semiconductor device. In a further aspect in step (d), the particles of the second conductivity type are applied by implanting p-type particles with a dose higher than, for example, $1*10^{12}$ cm$^{-2}$ and with energies higher than, for example, 10 keV.

Alternatively, when the method is adapted for producing an IGBT, in step (d), p-type particles such as Boron (B) may be implanted with a dose higher than, for example, $1 \times 10^{12}$ cm$^{-2}$, preferably higher than $5 \times 10^{12}$ cm$^{-2}$, and with energies higher than, for example, 10 keV, preferably higher than 25 keV.

According to the proposed new design rule, the buffer layer may be relatively thin such that the generation of buffer layer by implantation or deposition may be simplified.

It should be noted that aspects and embodiments of the present invention are described herein with reference to different subject-matter, For example, some embodiments are described with reference to methods whereas other embodiments are described with reference to apparatus. However, those skilled in the art will appreciate that, unless other notified, in addition to any combination of features belonging to one type of subject-matter, combinations between features relating to different subject-matter, such as between features of the apparatus type features and features of methods are also encompassed herein.

Figure 4:
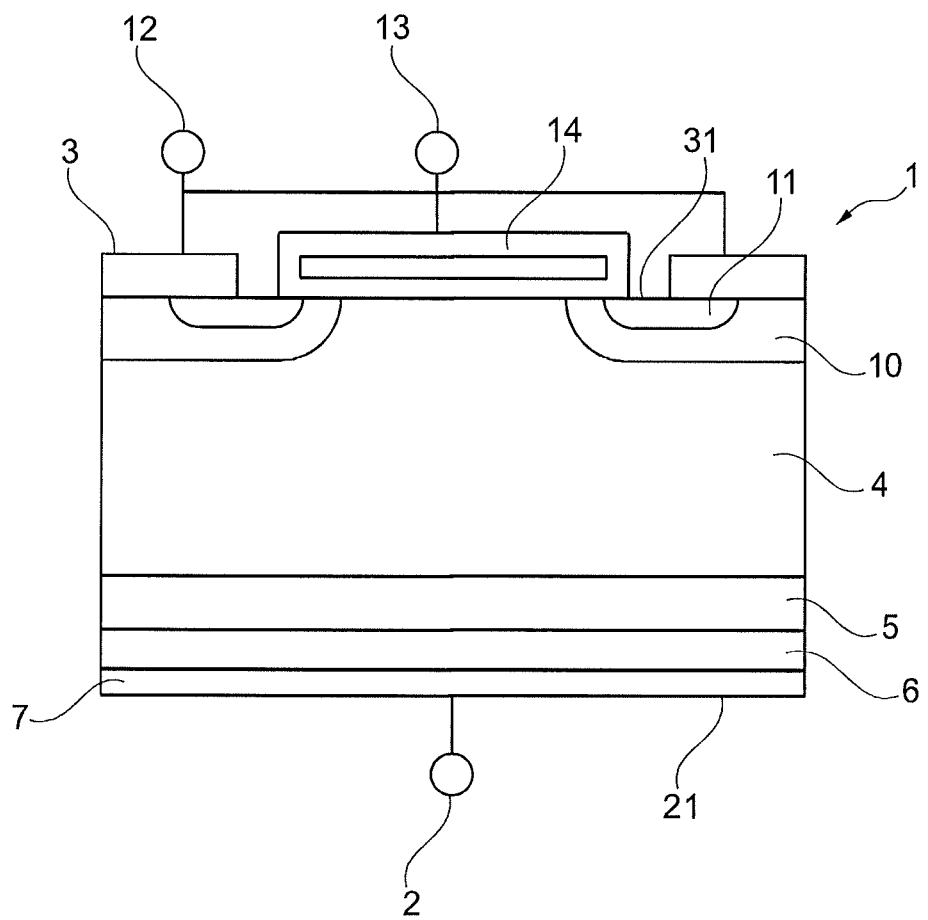
FIG. 4: shows a cross sectional view on a semiconductor device according to an exemplary embodiment as disclosed herein.

FIG. 4 shows an exemplary semiconductor module, as disclosed herein. The maximum-punch-through semiconductor device 1 is represented as an IGBT. It comprises a four-layer structure having a collector side 21 and an emitter side 31 lying opposite to the collector side 21. The layers provided on the emitter side 31 can comprise a p-doped channel region 10 which surrounds an n-doped source region 11. These regions 10, 11 are in electrical contact with an emitter electrode 12 via an emitter metallization 3. A gate electrode 13 is manufactured on top of the wafer, electrically insulated from the layers 10, 11 by an insulation layer 14. The gate electrode 13 can be formed as a planar gate electrode as shown in FIG. 4 or as a trench gate electrode.

A base layer 4 is located between the emitter metallization 3 and a collector metallization 7 on the collector side 21.

On the collector side 21, the collector metallization 7 is formed in contact with a collector layer 6 which may be formed in the finalized semiconductor device 1 by implantation or deposition of p-type particles. Underneath this collector layer 6 towards the emitter side 31, a buffer layer 5 is arranged which may be implemented into the finalized semiconductor device 1 by implantation or deposition of n-type particles.

Figure 2:
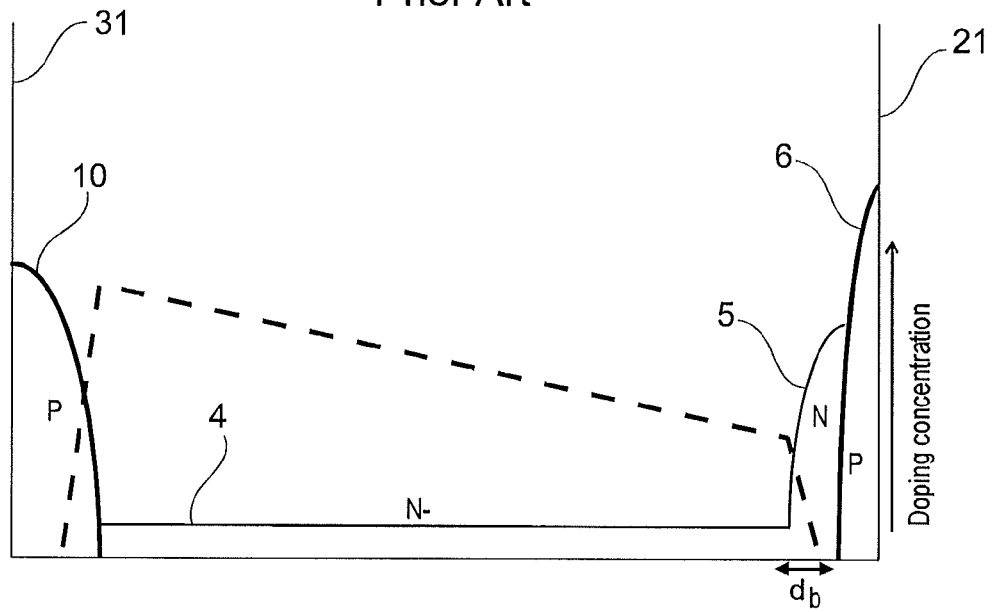
FIG. 2: shows a doping profile of a semiconductor module for a semiconductor device according to an exemplary embodiment as disclosed herein.

FIG. 2 schematically shows an exemplary doping concentration profile for a maximum-punch-through semiconductor device in accordance with an exemplary embodiment disclosed herein. On the emitter side 31, the doping profile of the p-type channel region 10 and of the adjacent (n−)-type base layer 4 is similar to the case of a known soft-punch-through semiconductor device. However, as can be easily derived by comparing with FIG. 1, on the collector side 21 the n-type buffer layer 5 of the maximum-punch-through semiconductor device according to the embodiment shown in FIG. 2 significantly differs from the buffer layer 15 of the known device as shown in FIG. 1. While the thickness of the known buffer layer 15 of the SPT device may be about 30 μm, the thickness $d_b$ of the buffer layer 5 of the MPT device may be less than 15 μm. The peak doping concentration of the buffer layer 5 can be above $1*10^{15}$ cm$^{-3}$ (e.g., for example, above $1*10^{16}$ cm$^{-3}$, and in particular below $1*10^{17}$ cm$^{-3}$). The thickness of the buffer layer 5 is, for example, between 1 μm and 15 μm (e.g., below 10 μm, in particular below 5 μm and in particular between 2 and 3 μm). Accordingly, as indicated by the dotted lines in FIGS. 1 and 2, while the electrical field in a known SPT device slowly drops within the buffer layer 15 towards the collector side 21, an electrical field in an MPT device according to exemplary embodiments disclosed herein abruptly drops within the shallow buffer layer 5.

The thickness W of the base layer is determined by (see the explanation to FIG. 5 for more details about the formula):

$$W = \frac{V_{bd} + V_{pt}}{4010 \text{ kVcm}^{-5/8} * (N_D)^{1/8}}$$

wherein a punch-through voltage $V_{pt}$ of the semiconductor device is between 70% and 99% of a break down voltage $V_{bd}$ of the semiconductor device, and wherein the thickness W is a minimum thickness of the base layer 4 between the junction to the channel region 10 and the buffer layer 5. In another exemplary aspect disclosed herein, the punch-through voltage $V_{pt}$ of the semiconductor device is between 75% and 99% of the break down voltage $V_{bd}$ of the semiconductor device, such as between 80 to 95%. Of course, it is technically equivalent to determine the thickness of the base layer from its doping concentration or to determine the doping concentration of the base layer from a given thickness. The break down voltage of the semiconductor device may be below, for example, 2500 V, such below 2200 V and in particular below 2000 V.

FIGS. 3a to 3c show simulated doping profiles and the corresponding electrical fields within a known non-punch-through NPT device (FIG. 3a), a known soft-punch-SPT device (FIG. 3b) and a maximum-punch-through MPT device according to an exemplary embodiment disclosed herein (FIG. 3c). All devices are rated at 1200 V. The electric field depends on the doping concentration and thickness of the base layer. Therefore, for a given doping concentration for the base layer, the electric field can be simulated over the whole depth of the base layer. Due to this simulation, it can be estimated, at which depth the electric field has dropped below a value of, for example, 40 kV/cm, such as below 20 kV/cm and in particular below 12 kV/cm. Therefore, in addition to the formula for the base layer thickness with the ratio of punch-through voltage and breakdown voltage being in a defined range, the thickness of the base layer can be further determined by the maximum electric field at the interface between base layer and buffer layer (e.g., at the depth of the thickness of the base layer). By arranging the buffer layer at this depth, it can be made very thin (e.g., between 1 μm and 15 μm, such as below 10 μm, in particular below 5 μm and in particular even as low as between 2 and 3 μm).

Table 1 shows NPT, SPT and MPT designs for 600 V, 900 V, 1200 V, and 1700 V semiconductor devices including the design parameters and relevant ratios.

The device can also be a diode. For a diode, the device comprises a buffer layer 5 in form of a diode cathode layer, the channel region 10 in form of an anode layer, the emitter metallization 3 in form of a diode anode metallization and the collector metallization 7 in form of a cathode metallization. There is no source region or collector layer present in a diode.

TABLE 1

| | | | | | |
|---|---|---|---|---|---|
| $V_r$ (Rating) | V | 600 | 900 | 1200 | 1700 |
| $V_{dc}$ (DC Link) | V | 300 | 450 | 600 | 900 SPT |
| Base Resistivity | ohm · cm | 32 | 52 | 65 | 104 |
| Base Doping | /cm$^3$ | 1.36E+14 | 8.30E+13 | 6.62E+13 | 4.11E+13 |
| W (N- Base Thickness) | μm | 45 | 75 | 105 | 175 |
| Buffer Thickness | μm | 30 | 30 | 30 | 30 |
| Total Thickness | μm | 75 | 105 | 135 | 205 |
| PN Junction Depth | μm | 10 | 10 | 10 | 10 |
| Total N Region | μm | 65 | 95 | 125 | 195 |
| $V_{bd}$ (breakdown) | V | 717 | 1107 | 1417 | 2120 |

TABLE 1-continued

| | | | | | | |
|---|---|---|---|---|---|---|
| $V_{pt}$ (Punch-Through) | V | 299 | 458 | 677 | 1088 | |
| $V_{br}/W$ | V/μm | 15.93 | 14.76 | 13.50 | 12.11 | |
| $V_{br}/V_r$ | | 1.20 | 1.23 | 1.18 | 1.25 | |
| $V_{pt}/V_{do}$ | | 1.00 | 1.02 | 1.13 | 1.21 | |
| $V_{pt}/V_{bd}$ | | 0.42 | 0.41 | 0.48 | 0.51 | |
| $V_{pt}/V_r$ | | 0.50 | 0.51 | 0.56 | 0.64 | |
| | | | | | | |
| $V_r$ (Rating) | V | 600 | 900 | 1200 | 1700 | |
| $V_{dc}$ (DC Link) | V | 300 | 450 | 600 | 900 | NPT |
| | | | | | | |
| Base Resistivity | ohm · cm | 25 | 38 | 52 | 84 | |
| Base Doping | /cm³ | 1.75E+14 | 1.11E+14 | 8.30E+13 | 5.10E+13 | |
| W (N- Base Thickness) | μm | 100 | 140 | 180 | 270 | |
| Buffer Thickness | μm | 0 | 0 | 0 | 0 | |
| | | | | | | |
| Total Thickness | μm | 100 | 140 | 180 | 270 | |
| PN Junction Depth | μm | 10 | 10 | 10 | 10 | |
| Total N Region | μm | 90 | 130 | 170 | 260 | |
| $V_{bd}$ (breakdown) | V | 860 | 1181 | 1455 | 2068 | |
| $V_{pt}$ (Punch-Through) | V | 0 | 0 | 0 | 0 | |
| $V_{br}/W$ | V/μm | 8.60 | 8.44 | 8.08 | 7.66 | |
| $V_{br}/V_r$ | | 1.43 | 1.31 | 1.21 | 1.22 | |
| | | | | | | |
| $V_r$ (Rating) | V | 600 | 900 | 1200 | 1700 | |
| $V_{dc}$ (DC Link) | V | 300 | 450 | 600 | 900 | MPT |
| | | | | | | |
| Base Resistivity | ohm · cm | 25 | 38 | 54 | 86 | |
| Base Doping | /cm³ | 1.08E+14 | 1.11E+14 | 8.00E+13 | 5.00E+13 | |
| W (N- Base Thickness) | μm | 75 | 105 | 145 | 215 | |
| Buffer Thickness | μm | 5 | 5 | 5 | 5 | |
| | | | | | | |
| Total Thickness | μm | 80 | 110 | 150 | 220 | |
| PN Junction Depth | μm | 10 | 10 | 10 | 10 | |
| Total N Region | μm | 70 | 100 | 140 | 210 | |
| $V_{bd}$ (breakdown) | V | 842 | 1136 | 1476 | 2078 | |
| $V_{pt}$ (Punch-Through) | V | 623 | 840 | 1164 | 1643 | |
| $V_{br}/W$ | V/μm | 11.23 | 10.82 | 10.18 | 9.67 | |
| $V_{br}/V_r$ | | 1.40 | 1.26 | 1.23 | 1.22 | |
| $V_{pt}/V_{do}$ | | 2.08 | 1.87 | 1.94 | 1.33 | |
| $V_{pt}/V_{bd}$ | | 0.74 | 0.74 | 0.79 | 0.79 | |
| $V_{pt}/V_r$ | | 1.04 | 0.93 | 0.97 | 0.97 | |

Figure 5:
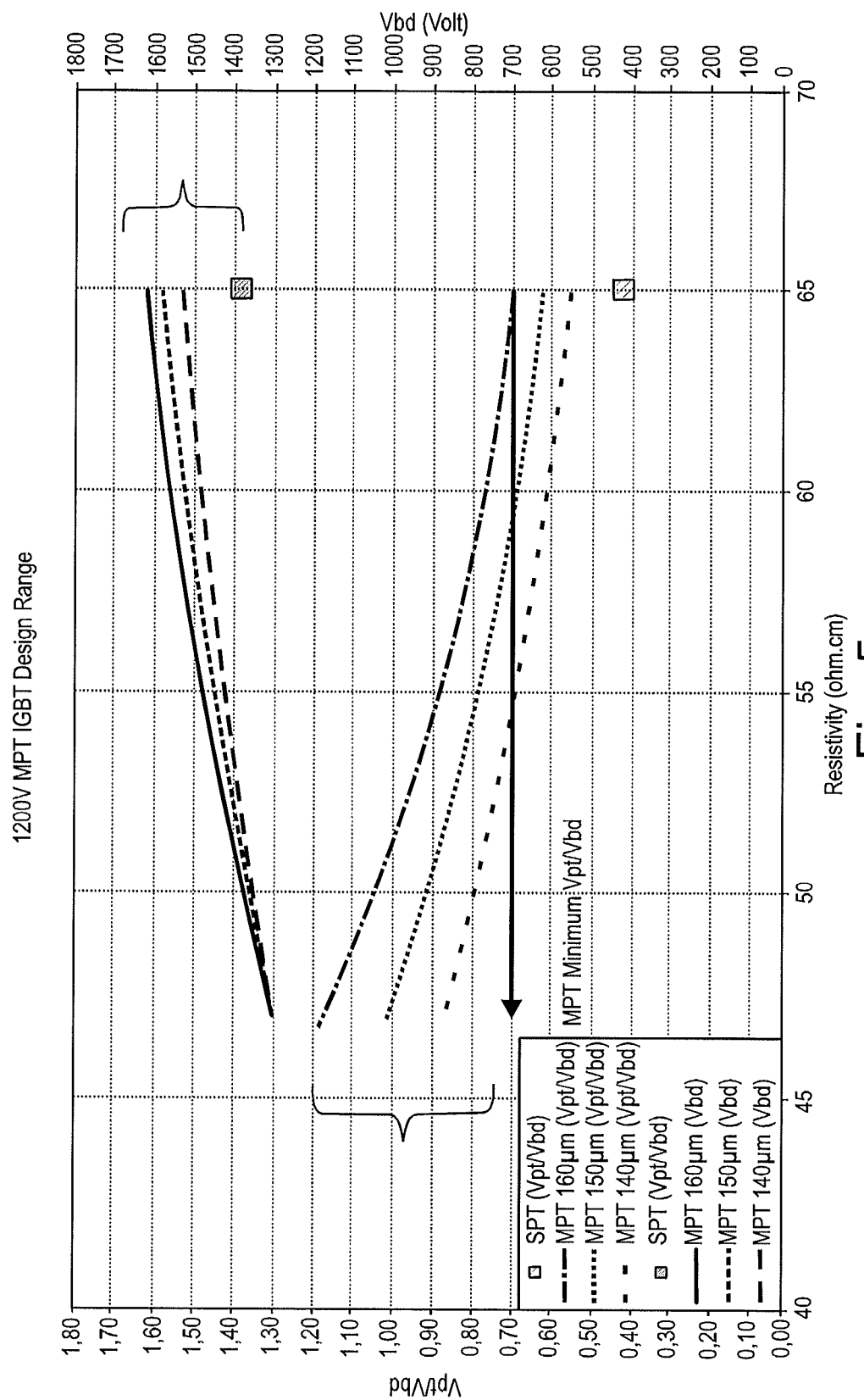
FIG. 5: shows a graph representing a ratio of the punch-through-voltage and the break-down-voltage in dependence of a base layer resistivity as well as the break-down-voltage in dependence of a base layer resistivity for different punch-through devices according to exemplary embodiments as disclosed herein.

FIG. 5 shows a representation of a ratio $V_{pt}/V_{bd}$ of the punch-through-voltage $V_{pt}$ and the break-down-voltage $V_{bd}$ in dependence of the resistivity (left hand side ordinate and lower three curves). Furthermore, a representation of the break-down-voltage $V_{bd}$ in dependence of the resistivity is also shown in FIG. 5 (right hand ordinate and upper three curves). The curves refer to maximum-punch-through MPT semiconductor devices rated 1200 V and having a total thickness of 140 μm, 150 μm and 160 μm, respectively. For comparison, also a value for a soft-punch-through SPT semiconductor device is indicated.

The parameter values used for calculating the graphs are represented in table 2. Therein, the break-down-voltage $V_{bd}$ has been calculated according to:

$$V_{bd} = E_c \cdot W - \frac{1}{2}\frac{q \cdot N_D \cdot W^2}{\varepsilon_s}$$

Calculation of $V_{bd}$ includes a Fudge Factor of 0.85 for the First term on the right hand side ($E_cW$) to account for an exemplary realistic critical electric field obtained in real devices. The exemplary critical electric field $E_c$ has been calculated according to:

$$E_c = 4010 \cdot V cm^{-5/8}(N_D)^{1/8}$$

The critical electric field calculated according to this formula provides only an indication on the onset of breakdown. This definition is well known to the experts and is used for designing semiconductor devices.

The punch-through voltage $V_{pt}$ has been calculated according to:

$$V_{pt} = \frac{q \cdot N_D \cdot W^2}{2 \cdot \varepsilon_s}$$

By combining these formulas, the thickness W of the base layer as the minimum thickness of the base layer between the junction to the channel region 10 and the buffer layer 5 can be estimated by:

$$W = \frac{V_{bd} + V_{pt}}{4010 \text{ kVcm}^{-5/8} * (N_D)^{1/8}}$$

In the simulations, a buffer layer thickness of 5 μm has been assumed for all MPT devices. For the SPT device, a non depleted buffer layer thickness of 10 μm has been assumed. A depth of the pn-junction of 10 μm, a permittivity $\varepsilon_s$ of $1.05 \cdot 10^{-12}$ F/cm and an electron charge q of $1.602 \cdot 10^{-19}$ C has been assumed for all devices.

TABLE 2

| 1200 V | Resistivity ohm·cm | Base Doping Concentration $N_D$ (Atom/cm³) | Base Region Width (W) μm | Undepleted Buffer Thickness μm | Total Thickness μm | Critical Field $E_c$ (V/cm) | Breakdown Voltage $V_{bd}$ (Volt) | Punch Through Voltage $V_{pt}$ (Volt) | $V_{pt}/V_{bd}$ Ratio |
|---|---|---|---|---|---|---|---|---|---|
| SPT | 65 | 6.62E+13 | 115 | 10 | 135 | 2.14E+05 | 1425 | 668 | 0.47 |
| MPT 160 μm | 65 | 6.62E+13 | 145 | 5 | 160 | 2.14E+05 | 1577 | 1062 | 0.67 |
|  | 62 | 6.94E+13 | 145 | 5 | 160 | 2.15E+05 | 1542 | 1114 | 0.72 |
|  | 59 | 7.30E+13 | 145 | 5 | 160 | 2.17E+05 | 1502 | 1170 | 0.78 |
|  | 56 | 7.69E+13 | 145 | 5 | 160 | 2.18E+05 | 1456 | 1233 | 0.85 |
|  | 53 | 8.12E+13 | 145 | 5 | 160 | 2.20E+05 | 1405 | 1303 | 0.93 |
|  | 50 | 8.61E+13 | 145 | 5 | 160 | 2.21E+05 | 1347 | 1381 | 1.03 |
|  | 47 | 9.16E+13 | 145 | 5 | 160 | 2.23E+05 | 1280 | 1469 | 1.15 |
| MPT 150 μm | 65 | 6.62E+13 | 135 | 5 | 150 | 2.14E+05 | 1537 | 921 | 0.60 |
|  | 62 | 6.94E+13 | 135 | 5 | 150 | 2.15E+05 | 1507 | 965 | 0.64 |
|  | 59 | 7.30E+13 | 135 | 5 | 150 | 2.17E+05 | 1473 | 1014 | 0.69 |
|  | 56 | 7.69E+13 | 135 | 5 | 150 | 2.18E+05 | 1435 | 1069 | 0.74 |
|  | 53 | 8.12E+13 | 135 | 5 | 150 | 2.20E+05 | 1392 | 1129 | 0.81 |
|  | 50 | 8.61E+13 | 135 | 5 | 150 | 2.21E+05 | 1343 | 1197 | 0.89 |
|  | 47 | 9.16E+13 | 135 | 5 | 150 | 2.23E+05 | 1286 | 1273 | 0.99 |
| MPT 140 μm | 65 | 6.62E+13 | 125 | 5 | 140 | 2.14E+05 | 1486 | 789 | 0.53 |
|  | 62 | 6.94E+13 | 125 | 5 | 140 | 2.15E+05 | 1461 | 828 | 0.57 |
|  | 59 | 7.30E+13 | 125 | 5 | 140 | 2.17E+05 | 1434 | 870 | 0.61 |
|  | 56 | 7.69E+13 | 125 | 5 | 140 | 2.18E+05 | 1402 | 916 | 0.65 |
|  | 53 | 8.12E+13 | 125 | 5 | 140 | 2.20E+05 | 1366 | 968 | 0.71 |
|  | 50 | 8.61E+13 | 125 | 5 | 140 | 2.21E+05 | 1325 | 1026 | 0.77 |
|  | 47 | 9.16E+13 | 125 | 5 | 140 | 2.23E+05 | 1278 | 1092 | 0.85 |

In order to produce a maximum-punch-through semiconductor device according to an exemplary embodiment disclosed herein, an n-type wafer with a resistivity of for example 50 Ωcm and a base doping concentration of $9*10^{13}$ cm$^{-3}$ may be provided as a wafer. On a first side which, in the finalized semiconductor device forms the emitter side, one or more layers for forming an emitter structure (e.g. channel region, source region) may be produced for example by diffusion processes. Then, the wafer which originally may have a thickness of for example more than 300 μm may be thinned on its second side to a predetermined thickness of for example 140 μm according to the rule for the base layer thickness disclosed herein, based on a given punch-through voltage, breakdown voltage and eventually also on the electric field. This may be done for example by grinding, and etching. Then, a buffer design may be implemented into the second side of the wafer by applying n-type particles such as phosphor or arsenic atoms. These particles may be implanted via low energy implantation with a dose of for example more than $1*10^{12}$ cm$^{-2}$ and energies of more than 100 keV. With such implantation parameters, a buffer design with an exemplary thickness in a range of 1 μm to 10 μm may be generated. Subsequently, a low temperature annealing step at an exemplary temperature below 500° C. may be applied. Alternatively, laser annealing may be used.

Alternatively, hydrogen atoms may be implanted at an exemplary low energy of above 100 keV or even above 200 keV with doses of more than $1*10^{12}$ cm$^{-2}$ followed by a low temperature annealing below 500° C. or even below 450° C. Alternatively, a thin n-type silicon layer may be deposited on the collector side of the wafer. Further alternatively, a double implant thin buffer profile may be used.

For the specific case of producing an IGBT, a collector design using implantation of p-type dopants such as boron followed by low temperature annealing below 500° C. or laser annealing may be applied. Also, a thin p-type silicon layer may be deposited on the collector side of the wafer behind the buffer layer followed by the same annealing/tempering methods as above. The tempering of the buffer and the anode layer may be combined or separated depending on the processes employed. The particles of the second conductivity type are applied by implanting p-type particles with a dose higher than, for example, $1*10^{12}$ cm$^{-2}$ and with energies higher than, for example, 10 keV.

For the manufacturing of diodes, no p type collector layer and no n type source region is created.

The MPT design proposed herein may be applied to all types of IGBT cell designs including trench IGBTs and planar IGBTs. The addition of field oxide layers in the gate or enhancement layers which will normally result in local electric field points may bring an advantage by limiting the avalanche break down of the MPT device with minimum punch-through action and resulting in a higher $V_{pt}/V_{bd}$ ratio.

The MPT buffer design may be suitable for reverse conducting IGBT structures. Furthermore, the MPT concept may be applied to MOSFETs, diodes or other MOS bipolar structures.

It should be noted that the term "comprising" does not exclude other elements or steps and that the indefinite article "a" or "an" does not exclude the plural. Also elements described in association with different embodiments may be combined. It should also be noted that reference signs to the extent included in the claims shall not be construed as limiting the scope of the claims.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

Reference List

1: semiconductor device
2: collector
21: collector side
3: emitter
31: emitter side
4: base layer
5: buffer layer
6: collector layer 7: collector metallization
10: channel region
11: source region
12: emitter electrode
13: gate electrode
14: insulation layer
15: buffer layer (prior art)

The invention claimed is:

1. A maximum-punch-through semiconductor device having at least a two-layer structure comprising:
 a collector metallization on a collector side;
 an emitter metallization on an emitter side, which lies opposite the collector side;
 a base layer of a first conductivity type arranged between the emitter metallization and the collector metallization, and having a predetermined doping concentration $N_D$;
 a channel region of a second conductivity type arranged between the base layer and the emitter metallization;
 a buffer layer of the first conductivity type arranged between the base layer and the collector metallization, wherein the buffer layer has a thickness of between about 1 µm to about 3 µm and a peak doping concentration which is higher than a doping concentration of the base layer, a thickness W of the base layer being determined by:

$$W = \frac{V_{bd} + V_{pt}}{4010 \text{ kVcm}^{-5/8} * (N_D)^{1/8}}$$

wherein a punch-through voltage $V_{pt}$ of the semiconductor device is between 70% and 99% of a break down voltage $V_{bd}$ of the semiconductor device, and wherein the thickness W is a minimum thickness of the base layer between a junction to the channel region and the buffer layer.

2. The semiconductor device of claim 1, wherein the punch-through voltage $V_{pt}$ of the semiconductor device is between 75% and 99% of the break down voltage $V_{bd}$ of the semiconductor device.

3. The semiconductor device of claim 1, wherein the buffer layer is arranged such that an electric field at an interface between the base layer and the buffer layer is below 40 kV/cm.

4. The semiconductor device of claim 1, wherein the peak doping concentration of the buffer layer is above $1*10^{15}$ cm$^{-3}$.

5. The semiconductor device of claim 1, wherein the break down voltage of the semiconductor device is below 2500 V.

6. The semiconductor device of claim 1, wherein the semiconductor device is an insulated gate bipolar transistor with a source region of the first conductivity type between the channel region and the emitter metallization.

7. The semiconductor device of claim 1, wherein the semiconductor device is a diode with the buffer layer formed as a diode cathode layer, the channel region formed as an anode layer, the emitter metallization formed as a diode anode metallization and the collector metallization formed as a cathode metallization.

8. A method for producing a maximum-punch-through semiconductor device having at least a two-layer structure with layers of different conductivity types, the method comprising, in the following order:
 (a) providing a wafer of a first conductivity type, having a first emitter side in a finalized semiconductor device, and a second side lying opposite the first side, and which wafer has a doping concentration $N_D$;
 (b) producing a channel region of a second conductivity type on the first side; and
 (c) applying particles of the first conductivity type to the wafer on the second side, which particles form a buffer layer in the finalized semiconductor device, wherein that part of the wafer with unamended doping concentration in the finalized semiconductor device forms a base layer, and the buffer layer has a peak doping concentration higher than the doping concentration of the wafer, and wherein a thickness of the base layer is selected such that:

$$W = \frac{V_{bd} + V_{pt}}{4010 \text{ kVcm}^{-5/8} * (N_D)^{1/8}},$$

wherein a punch-through voltage $V_{pt}$ of the semiconductor device is between 70% and 99% of a break down voltage $V_{bd}$ of the semiconductor device.

9. The method of claim 8, wherein in step (c), the buffer layer is created such the buffer layer extends only to such a depth of the wafer from the second side that the electric field is lower than 40 kV/cm.

10. The method of claim 8, comprising after step (b):
 thinning the wafer on the second side to a predetermined thickness.

11. The method of claim 8, comprising in step (c):
 applying particles of the first conductivity type by implanting n-type particles or hydrogen particles with a dose higher than $1*10^{12}$ cm−2 and with energies higher than 100 keV.

12. The method of claim 8, adapted for producing an insulated gate bipolar transistor and comprising after step (c):
 (d) applying particles of the second conductivity type to the wafer on the second side, by implantation or deposition, which particles form a collector layer in the finalized semiconductor device.

13. The method of claim 12, comprising in step (d):
 applying the particles of the second conductivity type by implanting p-type particles with a dose higher than $1*10^{12}$ cm$^{-2}$ and with energies higher than 10 keV.

14. The method of claim 8, comprising after step (c):
 thermal annealing at temperatures below 500° C. or laser annealing.

15. The semiconductor device of claim 1, wherein the punch-through voltage $V_{pt}$ of the semiconductor device is between 80% and 95% of the break down voltage $V_{bd}$ of the semiconductor device.

16. The semiconductor device of claim 1, wherein the buffer layer is arranged such that an electric field at an interface between the base layer and the buffer layer is below 12 kV/cm.

17. The semiconductor device of claim 1, wherein the peak doping concentration of the buffer layer is above $1*10^{17}$ cm$^{-3}$.

18. The semiconductor device of claim 1, wherein a thickness of the buffer layer is between 2 µm and 3 µm.

19. The semiconductor device of claim 1, wherein the break down voltage of the semiconductor device is below 2000 V.

* * * * *